United States Patent [19]
Groe

[11] Patent Number: 6,060,950
[45] Date of Patent: May 9, 2000

[54] CONTROL OF A VARIABLE GAIN AMPLIFIER WITH A DELTA SIGMA MODULATOR D/A CONVERTER

[75] Inventor: John B. Groe, Poway, Calif.

[73] Assignee: Nokia Mobile Phones Limited, Espoo, Finland

[21] Appl. No.: 09/092,464

[22] Filed: Jun. 5, 1998

[51] Int. Cl.[7] .................................................. H03G 3/10
[52] U.S. Cl. ................................................ 330/279; 330/129
[58] Field of Search ................................. 330/279, 129; 455/232.1, 234.1, 234.2, 239.1, 240.1, 250.1; 375/345

[56] References Cited

U.S. PATENT DOCUMENTS

| | | |
|---|---|---|
| 5,083,304 | 1/1992 | Cahill ........................................ 375/98 |
| 5,283,536 | 2/1994 | Wheatley, III et al. ................. 330/279 |
| 5,722,062 | 2/1998 | Nakanishi et al. ..................... 455/247.1 |
| 5,737,033 | 4/1998 | Masuda ................................... 348/678 |

*Primary Examiner*—Benny Lee
*Assistant Examiner*—Henry Choe
*Attorney, Agent, or Firm*—Milan I. Patel; Holland & Hart LLP

[57] ABSTRACT

Apparatus, and an associated method, for generating a gain control signal for controlling operation of a variable gain amplifier. Gain control circuitry includes a delta sigma modulator which exhibits a noise transfer function for shifting noise components of a gain control signal formed therefrom upwards in frequency. Undesired modulation of portions of a received signal to be amplified by the amplifier, together with noise components of the gain control signal, thereby do not interfere with operation of apparatus in which the variable gain amplifier forms a portion.

16 Claims, 5 Drawing Sheets

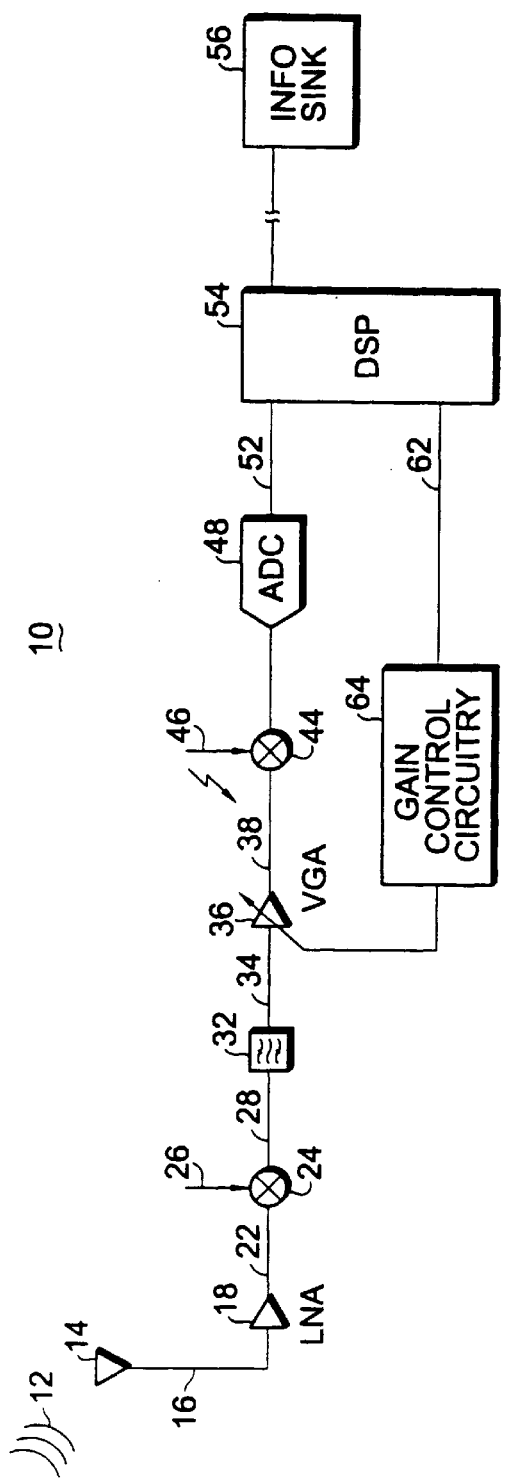
FIG. 1
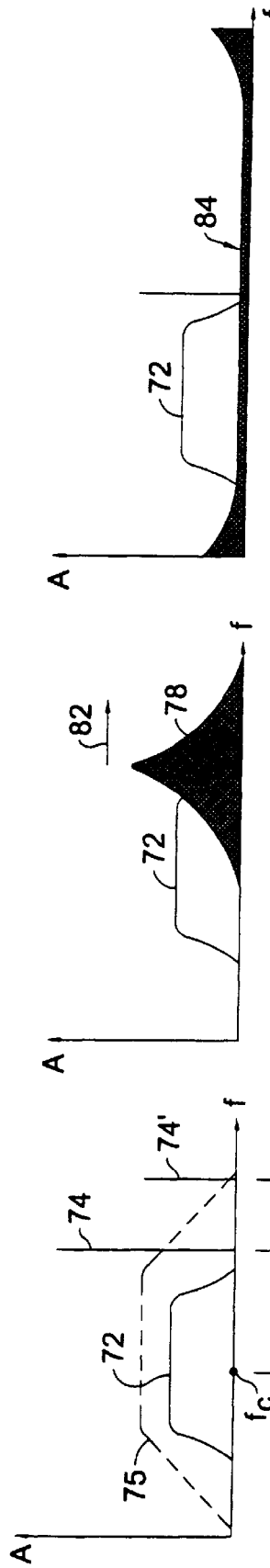
FIG. 2
FIG. 3A
FIG. 3B

CONTROL OF A VARIABLE GAIN AMPLIFIER WITH A DELTA SIGMA MODULATOR D/A CONVERTER

The present invention relates generally to a gain control circuit, such as a gain control circuit forming a portion of a radio telephone. More particularly, the present invention relates to apparatus, and an associated method, for generating a gain control signal for controlling the gain of a variable gain amplifier.

Noise shaping is performed upon the noise component of the gain control signal to shift the frequency of the noise component. Because of such shifting, interference sometimes otherwise caused through undesired interaction between an input signal applied to the variable gain amplifier to be amplified thereat and the noise component of the gain control signal is avoided.

A delta sigma modulator, or other noise shaper, is connected in a feedback arrangement with the variable gain amplifier and is used in the formation of the gain control signal. Because the delta sigma modulator exhibits a signal transfer function and a noise transfer function which are dissimilar, noise-shaping of the noise component by the modulator is provided to shift the noise component. The delta sigma modulator is coupled to a digital-to-analog converter to convert the gain control signal into analog form. Use of the delta sigma modulator also permits increase in the resolution of signals applied thereto, thereby to permit fine, i.e. high-resolution, gain control of the variable gain amplifier by the gain control signal, all without affecting the time response of the circuit.

BACKGROUND OF THE INVENTION

A communication system is operable to communicate information between a transmitting station and a receiving station by way of a communication channel. A radio communication system is a communication system in which the communication channel by which information is communicated between the transmitting and receiving stations is formed upon a portion of the electromagnetic spectrum. A cellular communication system is exemplary of a multi-user, radio communication system.

Various cellular communication systems have been developed and implemented throughout large geographical areas. Cellular communication systems have been developed and implemented utilizing FDMA (frequency division multiple access), TDMA (time division multiple access), CDMA (code division multiple access), and various combinations of such communication techniques.

Communication systems utilizing CDMA communication techniques advantageously provide the possibility of increased communication capacity levels within a given frequency bandwidth allocated to the communication system. That is to say, CDMA communication techniques provide the possibility to transmit a plurality of signals simultaneously over a common bandwidth. Because of the simultaneous nature of communications in a CDMA communication system, particular attention must be given to the power levels of signals communicated on such shared bandwidth.

Gain control circuitry is utilized at a transmitting station to control the signal levels of signals transmitted therefrom upon the communication channel. And, the receiving station includes gain control circuitry for modifying the gain of signals representative of receive signals received at the receiving station. Gain control circuitry is utilized in transmitting and receiving stations operable in other communication systems, including the aforementioned cellular communication systems. And, gain control circuitry is also used in other types of devices, used for other purposes.

Receiver circuitry operable to process a signal transmitted upon a communication channel sometimes receives not only a desired signal component, but also interfering signal components. The interfering signal components might be of greater signal levels than the desired signal components. Signals transmitted during operation of a communication system constructed according to, and in compliance with, the standards set forth in the IS-98 specification pertaining to an analog/CDMA cellular communication system, promulgated by the EIA/TIA, states the interfering signal components to be as close as a 900 kHz frequency offset from the center frequency of a desired signal and as large as 71 dBc above the desired signal. This situation is commonly referred to as single tone desensitization.

When such a receive signal is processed at a receiving station and applied to a variable gain amplifier of variable gain circuitry, problems sometimes occur. A variable gain amplifier, typically forms a portion of the IF (intermediate frequency) portion of a receiver. The gain of the variable gain amplifier is controlled by application of a gain control signal thereto. If the gain control signal includes noise components, such noise components, when applied to the variable gain amplifier together with the receive signal, amplitude modulate interfering signal components of the receive signal. The result of such undesired modulation includes side bands which might obscure the desired portion, i.e., information portion, of the receive signal.

While efforts have been made to overcome this problem, such efforts have been constrained by the limited resolution permitted of existing processing circuitry. Such processing circuitry sometimes forms a portion of a gain control loop by which the gain of the variable gain amplifier is controlled. That is to say, data words generated by digital processing circuitry forming a portion of the gain control loop are of limited word lengths. And, digital-to-analog converters, used to convert the data words into analog form for application to the variable gain amplifier, are limited to 8–10 bits. Another manner is a pulse density modulator (PDM) which has a large switching component in its output.

A manner by which to prevent noise components of a gain control signal applied to a variable gain amplifier of a gain control circuit from interfering with operation of the variable gain amplifier would therefore be advantageous.

It is in light of this background information related to gain control circuitry that the significant improvements of the present invention have evolved.

SUMMARY OF THE INVENTION

The present invention, accordingly, advantageously provides apparatus, and an associated method, which generates a gain control signal for application to a variable gain amplifier. Noise components which might form portions of the gain control signal are suitably offset in frequency so that any modulation of the noise components of the gain control signal together with interfering signal components of a signal applied to the variable gain amplifier to be amplified thereat shall not produce side bands which might interfere with proper operation of the amplifier.

In one implementation, the gain control signal is formed in a gain control circuit formed in a feedback connection with a variable gain amplifier. The feedback loop includes a delta sigma modulator, coupled to receive as inputs thereto, power control sequences generated by a power control algorithm of a digital signal processor. The digital signal processor, in turn, is coupled to receive, inter alia, indications of signal strength levels of signals amplified by a variable gain amplifier.

The delta sigma modulator exhibits a signal transfer function which is dissimilar to its noise transfer function. Because of such dissimilarity, the delta sigma modulator is constructed in a manner to shape the noise components of the sequences generated by the power control algorithm and applied to the modulator to shift the noise components in frequency. Sequences generated by the delta sigma modulator, i.e., the delta sigma-modulated signal, are applied to a digital-to-analog converter. Once converted into analog form, the analog signal forms the gain control signal which is applied to the variable gain amplifier to control amplification levels of the amplifier.

Because of the noise shifting by the delta sigma modulator of the noise components, such components forming the analog, gain control signal applied to the variable gain amplifier do not interfere with operation of the variable gain amplifier. Undesired modulation of the noise components of the gain control signal with interfering signal components of signals applied to the amplifier to be amplified thereat do not generate side bands which obscure the desired signal to be amplified by the amplifier.

In one implementation, the delta sigma modulator is constructed of CMOS (complementary metal oxide semiconductor) components formed on-chip with, or embodied in, a digital portion of a radio circuit. The digital-to-analog converter and the variable gain amplifier are, conversely, formed at an analog portion of the radio circuit.

In an exemplary implementation, an embodiment of the present invention forms a portion of receiver circuitry of a cellular radio telephone operable pursuant to the standards set forth in the IS-98 specification promulgated by the EIA/TIA. In this implementation, the delta sigma modulator, positioned in the feedback loop of a gain control circuit, attenuates noise components within a range of frequencies at least corresponding to the bandwidth of a receive channel upon which a receive signal is received by the radio telephone and 900 kHz offsets at the upper and lower ends of the receive-channel bandwidth. The delta sigma modulator, together with a digital-to-analog converter, generates a gain control signal for controlling amplification levels of a variable gain amplifier of the radio telephone receiver circuitry.

The delta sigma modulator provides a flexible interface block which controls operation of the variable gain amplifier. The modulator shapes noise, and other spurious components out of the critical frequency band of the receive channel, together with the frequency offsets. The delta sigma modulator is operable over a wide, dynamic range and is operable without delay of its time response.

In these and other aspects, therefore, gain control apparatus, and an associated method, is provided for selectively amplifying an input signal. A variable gain amplifier having a selectable gain characteristic is coupled to receive electrical signals representative of the input signal. The variable gain amplifier amplifies the electrical signals with a selected gain characteristic. A gain characteristic controller is coupled to the variable gain amplifier in a gain control loop. The gain characteristic controller generates a gain control signal of values which, when applied to the variable gain amplifier, are determinative of the selected gain characteristic by which the electrical signals are amplified. The gain characteristic controller shapes components of the gain control signals such that the noise components are of frequencies offset in frequency by a frequency offset at least a selected amount relative to a fundamental frequency of the noise components.

A more complete appreciation of the present invention and the scope thereof can be obtain from the accompanying drawings which are briefly summarized below, the following detailed description of the presently-preferred embodiments of the invention, and the appended claims.

BRIEF DESCRIPTION OF THE DRAWINGS

FIG. 1 illustrates a functional block diagram which includes the gain control circuitry of an embodiment of the present invention.

FIG. 2 illustrates a frequency representation of a receive signal, exemplary of a receive signal received by the receiver circuitry shown in FIG. 1.

FIGS. 3A and 3B illustrate frequency representations of an amplified signal generated by a variable gain amplifier of the receiver circuitry shown in FIG. 1 responsive to reception by the receiver circuitry of the receive signal shown in FIG. 2.

DETAILED DESCRIPTION

Figure 4:
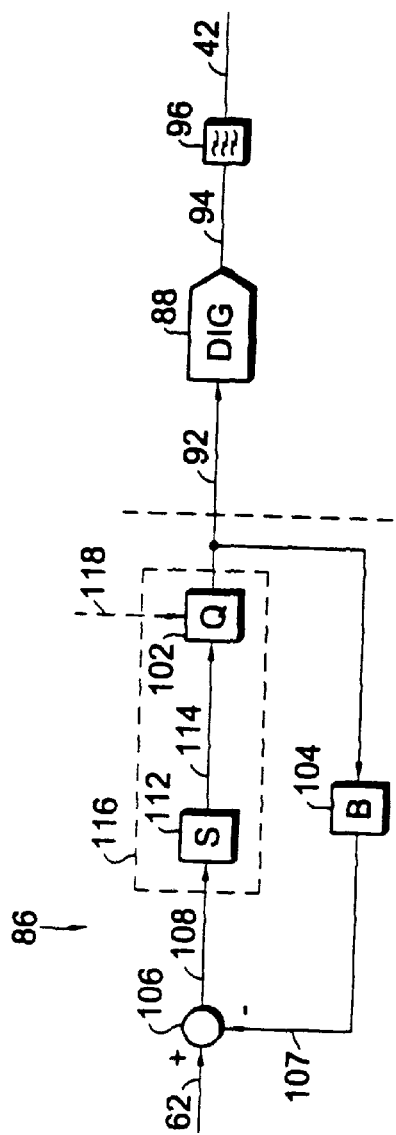
FIG. 4 illustrates a functional block diagram of a delta sigma modulator forming a portion of the gain control circuitry of an embodiment of the present invention.

Referring first to FIG. 1, a receiver, shown generally at 10, is operable to receive a receive signal 12. In the exemplary illustration, the receiver 10 comprises a radio receiver, and the receive signal 12 is an electromagnetic signal generated upon a communication channel defined upon a portion of the electromagnetic spectrum. In other implementations, the receiver 10 is alternately formed of another type of receiver operable to receive a receive signal transmitted on another type of communication channel.

The receive signal 12 is received by an antennae transducer 14 which converts the electromagnetic waves forming the receive signal into the electrical from on the line 16. The line 16 is here coupled to a low noise amplifier 18 which is operable to amplify the electrical signal generated upon the line 16. The amplifier 18 generates an amplified, electrical signal on the line 22 which is applied to a first input of a down mixer 24. A down-mixing signal is applied to a second input of the down-mixer 24 by way of the line 26.

The down mixer 24 generates a first down-converted signal, here an intermediate frequency signal, on the line 28. The intermediate frequency signal generated on the line 28 is filtered by a filter 32. And, a filtered, intermediate frequency signal, representative of the receive signal 12, is generated on the line 34. The line 34 is coupled to an input of a variable gain amplifier 36.

The variable gain amplifier 36 is operable to amplify the signal applied thereto on the line 34 with a selected amount of gain and to generate an amplified signal on the line 38. The level of gain by which the amplifier 36 amplifies the signal applied thereto on the line 34 is determined by a gain control signal applied to the amplifier by way of the line 42.

The amplified signal generated on the line 38 is applied to a first input of a second down mixer 44. A down mixing signal, generated on the line 46, is applied to a second input of the down mixer 44. The down mixer 44 is operable to generate a second down-mixed signal, here a base band signal on the line 46. The base band signal generated on the line 46 is applied to an A/D (analog-to-digital) converter 48. And, a digital base band signal is generated on the line 52 and applied to a DSP (digital signal processor) 54. The DSP 54 is operable to process the digital, base band signal applied thereto. Such processing includes, inter alia, generation of signals for application to an information sink 56, such as an acoustic transducer.

The DSP 54 is also operable to execute a power control algorithm to determine appropriate amplitude levels of amplified signals generated by the amplifier 36. Sequences generated responsive to execution of the power control algorithm are generated on the line 62 and are applied to gain control circuitry 64. The gain control circuitry 64 functions as a controller to control, through its operation, the gain of the amplifier 36. In manners which shall be described below, the gain control circuitry 64 is operable to generate a gain control signal on the line 42 to control the gain of the variable gain amplifier 36. The gain control circuitry is operable to generate a gain control signal in which noise component portions of the gain control signal are shifted in frequency. The noise component portions are shifted in manner to prevent amplitude modulation by such noise components of a close-in interfering signal component of the electrical signal representative of the receive signal applied on the line 34 to the amplifier 36, as described previously. The time response of the gain control circuitry 64 permits a near-immediate generation of gain control signal values responsive to input sequences provided thereto. Further, the gain control circuitry 64 is operable over a wide, dynamic range of operation.

FIG. 2 illustrates a frequency representation of an exemplary receive signal 12 received at the receiver 10 during operation of an embodiment of the present invention. In conventional fashion, the receiver 10 is operable to receive and process the receive signal 12 transmitted on a communication channel of a selected bandwidth. Here, the receive signal is formed of a desired signal component 72 and interfering components 74. The desired signal component is defined by a center frequency $f_c$, and the interfering components 74 is offset from the center frequency by at least 900 kHz. Electrical signal is generated on the line 16 and down-converted signals generated, e.g., on the lines 28 and 34 are analogously represented by the frequency representation shown in the Figure, with appropriate down-conversion in frequency. The passband 75 of an IF (intermediate frequency) filter is also shown in the Figure. As illustrated, at increased frequencies, greater attenuation occurs. The interfering component 74', e.g., is more greatly attenuated than is the component 74. Filter 32 attenuates wide-spaced interferers but has only a minor effect on close-in interferers.

FIG. 3A again illustrates the desired component of the receive signal 72, here subsequent to amplification by the variable gain amplifier 36. A modulated component 78 is also shown in the Figure. As illustrated, the modulated component 78 overlaps with the desired signal component 36. The modulated component 78 is representative of amplitude modulation of the interfering component 74 (shown in FIG. 2) by noise components of the gain control signal applied by way of the line 42 to the variable gain amplifier 36 when the noise components are located in frequency close to the frequency of the desired signal component 36. Operation of an embodiment of the present invention shapes the noise components of the gain control signal such that the modulated component 78 is shifted in frequency in the direction indicated by the arrows 82. By shifting the modulation component 78 away from the desired signal component 72, corruption of the receive signal and desensitization of the receiver is avoided.

FIG. 3B again illustrates the desired component of the receive signal 72, here again subsequent to amplification by the variable gain amplifier 36. A modulated component 84 is also shown in the Figure. Comparison of the modulated component 84 with the modulated component 78 shown in FIG. 3A indicates that the modulation by the noise component produced within the delta sigma modulator D/A converter results in less desensitization.

FIG. 4 illustrates the gain control circuitry 64 of the gain control loop 68, shown in FIG. 1. The gain control circuitry 64 is here shown to include a delta sigma modulator 86 and a digital-to-analog converter 88. The delta sigma modulator 86 is coupled to receive the sequences generated by the DSP 54 (shown in FIG. 1) on the line 62 and to generate delta sigma-modulated signals on the line 92 for application to the digital-to-analog converter 88. Analog signals generated by the converter 88 are generated on the line 94, filtered by a filter 96. The filtered signal generated by the filter 96 form the gain control signals generated on the line 42 for application to the amplifier 36 (shown in FIG. 1).

The delta sigma modulator 86 is functionally represented, here as a first order device. The modulator 86 alternately is formed of a higher-order device. The modulator 86 is here shown to include a quantizer 102, a filter 104 having a gain B coupled in a feedback arrangement between an output side of the quantizer 102 and to a negative input of a summing device 106 by way of the line 107. The line 62 is coupled to a positive input of the summing device 106. Values summed at the summing device 106 are generated on the line 108 which is coupled to a filter element 112. The filter element 112 filters the sequences of values received thereat and generates a filtered signal on the line 114 which is coupled to the quantizer 102. The filter element 112 and the quantizer 102 together define a gain A, here represented by the block 116, shown in dash. A line 118, also shown in dash, is representative of the application of noise and spurious signals whose frequency characteristics are shaped during operation of the modulator 86.

Figure 5:
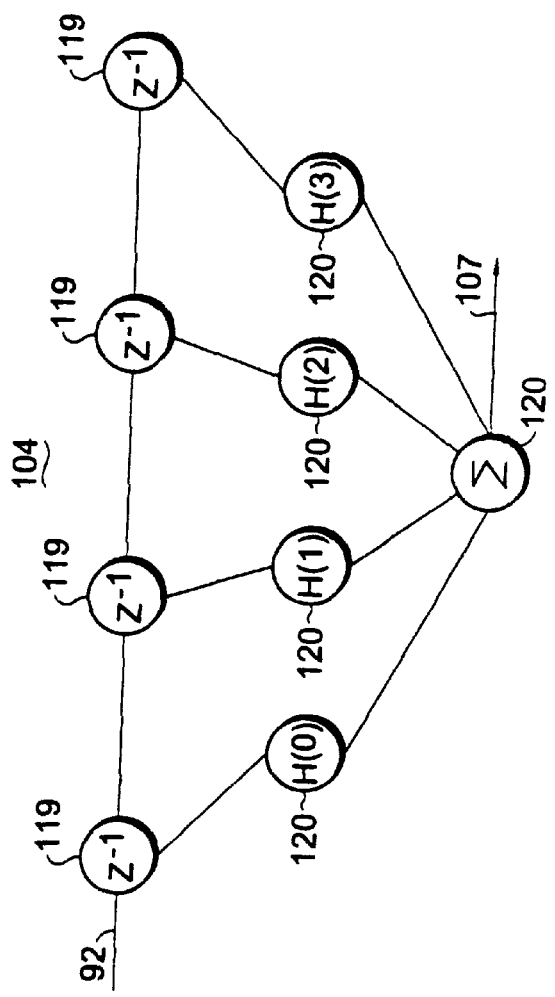
FIG. 5 illustrates an exemplary implementation of a portion of the delta sigma modulator shown in FIG. 4.

FIG. 5 illustrates an exemplary implementation of the filter 104 connected in the feedback path of the modulator 86. The filter 104 here forms a FIR (finite impulse response) filter having a series of delay elements 119 and gain elements 120. The line 92 forms an input to the filter 104. The values obtained from the separate paths of the filter are summed together by a summer 121, and the summed result is generated on the output line 107.

The delta sigma modulator 86 is a differential pulse code modulator that decorrelates a signal prior to its quantization. The correlation between adjacent samples received by, and operated upon, by the modulator increases as a square of the sampling frequency of such sequences. Correspondingly, the variances of the decorrelated signal decreases as the sampling frequency increases. Operation of the quantizer 102 is simplified as a result of these principles.

The modulator 86 has associated therewith an SNR (signal-to-noise ratio). The SNR performance of the modulator is affected by shaping the quantization noise which is white noise. The signal is sampled at a sampling rate significantly greater than the Nyquist rate, and the noise is filtered by the filter element 112 prior to quantization. The modulator 86 is able to discriminate between signal components and noise components, and the signal transfer function, STF, and the noise transfer function, NTF, of the modulator 86 are distinct from one another.

As the gains of the elements 104 and 116 are represented by B(s) and A(s), the STF and the NTF are represented as follows:

$$STF(s) = \frac{A(s)}{[1 + AB(s)]} \qquad NTF(s) = \frac{1}{[1 + AB(s)]}$$

The output of the modulator 86 thereby includes two components. A first component is formed the input sequence provided on the line 62 and modified by the STF of the modulator. And, a second component is formed of a noise component, represented in FIG. 4 by the noise added by way of the line 118 and modified by the NTF of the modulator. Through appropriate selection of the values of A and B, the signal noise transfer functions can be caused to exhibit desired characteristics. Namely, the STF is caused to be of "flat" characteristics at low frequencies. And, the NTF is caused to exhibit a high-pass response, attenuating quantization noise at low frequencies and amplifying the noise at high frequencies. Thereby, the NTF of the modulator provides noise shaping properties to the modulator to describe its advantageous performance in a gain control loop.

The delta sigma modulator 86 is realized in digital form to receive N-bit digital words on the input lines 62. Such words are combined with the digitally-filtered version of the word generated by the quantizer 102. Sequences summed by the summer 106 are acted upon by the filter 112, which together with the quantizer 102 exhibits a gain of A. The quantizer 102 is operable to truncate the sequences applied thereto, and to pass the most significant bit thereof. The digital filters 104 and 112, summer 106, and quantizer 102 all operate at a high sampling frequency. The delta sigma modulator 86 is advantageously implemented with CMOS (complementary metal oxide semiconductor) technology.

The converter 88 is here formed of a two-level D/A (digital-to-analog) converter. And, the analog filter 96 is of filter characteristics to attenuate high frequency noise amplified by the modulator 86. The resultant gain control signal generated on the line 42 is an analog signal representing the N-bit digital word applied to the modulator 86 on the line 62.

Figure 6:
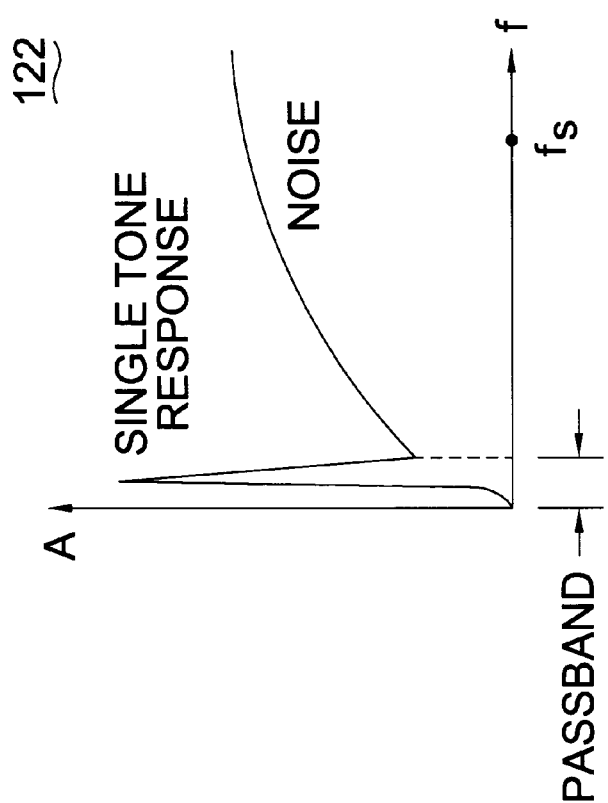
FIG. 6 illustrates a representation of the frequency spectrum of the delta sigma modulator shown in FIG. 4.

FIG. 6 illustrates the frequency spectrum, shown at 92, of the delta sigma modulator. The spectrum shows graphically the passband of the modulator, through appropriate selection of the STF. At higher frequencies to which noise components are shifted, the spectrum no longer attenuates such components. But, the noise components are shifted high enough in frequency not to interfere with circuit operation.

Figure 7:
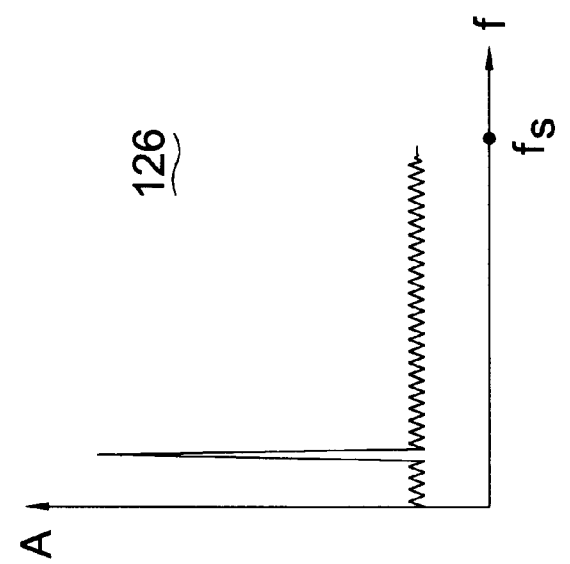
FIG. 7 illustrates a representation of the composite frequency spectrum of a gain control signal generated during operation of an embodiment of the present invention.

FIG. 7 illustrates the frequency response, shown at 42, of the delta sigma modulator 86. The filter response 42 is determined by the sampling frequency and the delay of the filters forming the modulator. The sampling frequency is selected to be high to decrease the variance between decorrelated signals and to simplify the quantizer 102 of the modulator. The digital filter delay of the filters 104 and 112 is related to the sampling frequency and the maximum tap delays of the FIR filter implementations thereof. The tap delay is small so as not to affect the time response of the modulator. And, the filter 96 is constructed to reduce high frequency noise. The delay of the filter 96 is small compared to a simple reconstructive filter, which is tied to data rates. The response of the delta sigma modulator 86, in contrast, is independent of the data rate. The digital-to-analog converter 86 and filter 96 can also be realized by a delta sigma demodulator.

The converter 88 and the filter 96, being analog elements, are advantageously integrated with the variable gain amplifier 36 (shown in FIG. 1) using an analog process. The line 92 interconnecting the modulator 86 and the converter 88 is, in one embodiment, operable to provide a single-ended signal. In another implementation, the line 92 includes separate portions, and differential signals are applied to the converter 88.

Figure 8:
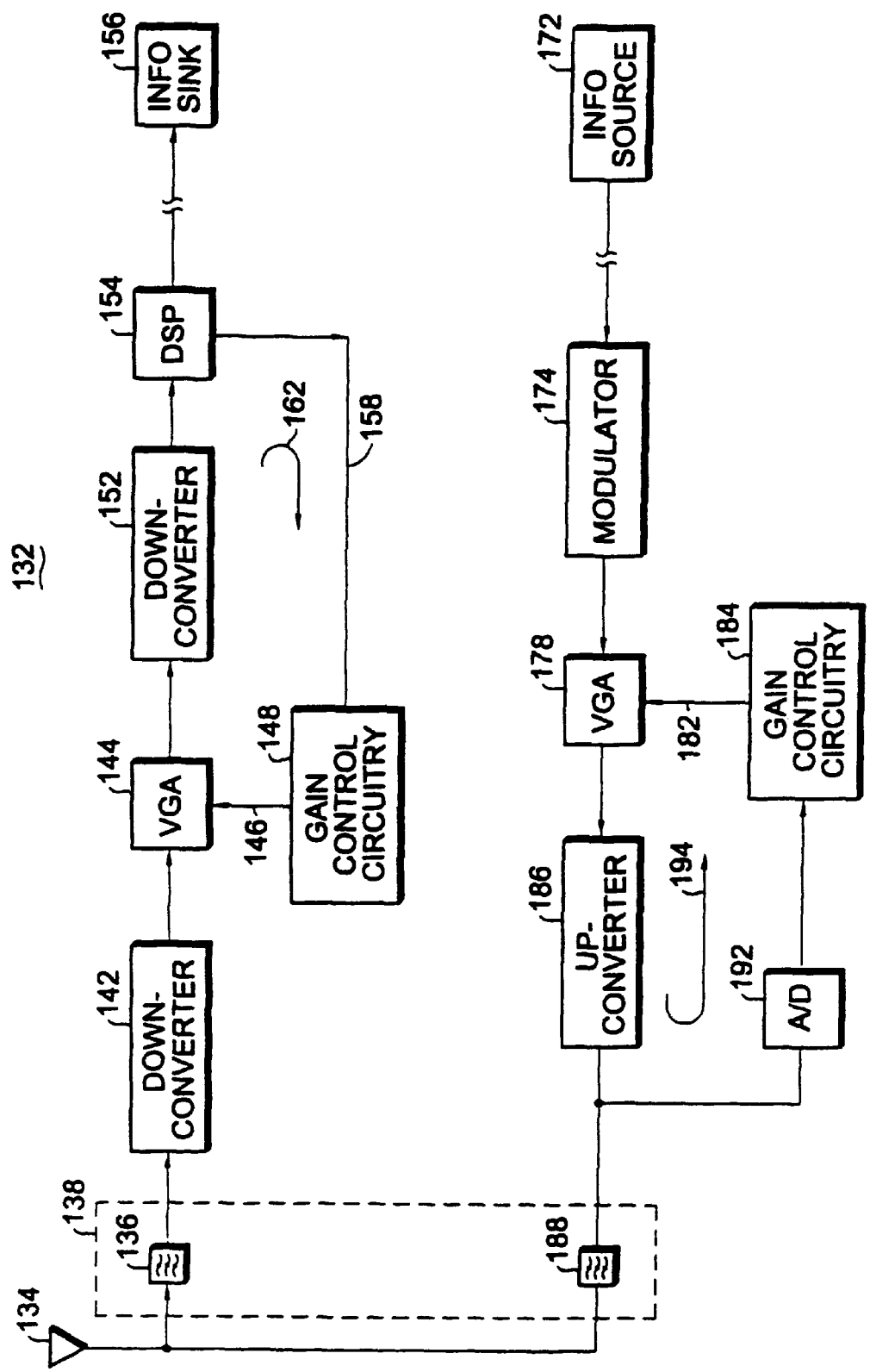
FIG. 8 illustrates a functional block diagram of a radio telephone which includes an embodiment of the present invention.

FIG. 8 illustrates a cellular radio telephone, shown generally at 132, which includes the gain control circuitry of an embodiment of the present invention. The radio telephone includes a receiver portion to process receive signals received at the antennae transducer 134. The transducer 134 converts electromagnetic signals into electrical signals which are filtered by a filter portion 136 of a duplexer filter 138. Filtered signals are applied to down-conversion circuitry 142, and down-converted signals are applied to a variable gain amplifier 144. The amplifier 144 is coupled to receive a gain control signal on the line 146, generated by gain control circuitry 148.

Amplified signals generated by the amplifier 144 provided to second down-conversion circuitry 152 whereat base band signals are formed and provided to the DSP (digital signal processor) 154. The DSP 154 generates the signals which are applied to an information sink 156. And, the DSP 154 is operable to execute a power control algorithm and to generate power control sequences on the line 158 for application to the gain control circuitry 148. The gain control circuitry 148 is analogous to the circuitry 64 shown in FIG. 1. As connected, a gain control loop, indicated by the arrow 162, is formed, thereby to control the levels of gain of the variable gain amplifier 144.

The radio telephone 132 further includes a transmitter portion to transmit signals generated by an information source 172. Signals generated by the information source are provided to a modulator 174 to form modulated signals according to an appropriate modulation technique. Modulated signals generated by the modulator 174 are provided to a variable gain amplifier 178. The variable gain amplifier 178 is also coupled to receive a gain control signal generated on the line 182 by gain control circuitry 184.

Amplified signals generated by the amplifier 178 are provided to up-conversion circuitry 186 which is filtered by filter circuitry 188 of the duplexer 138 and provided to the antennae transducer 134. The up-converted signals generated by the up-converter 186 are also provided to an analog-to-digital converter 192. And, digitized signals are provided to the gain control circuitry 184. The gain control circuitry 184 corresponds to the gain control circuitry 64 shown in FIG. 1. As connected, a feedback loop, represented by the arrow 194 is formed.

Figure 9:
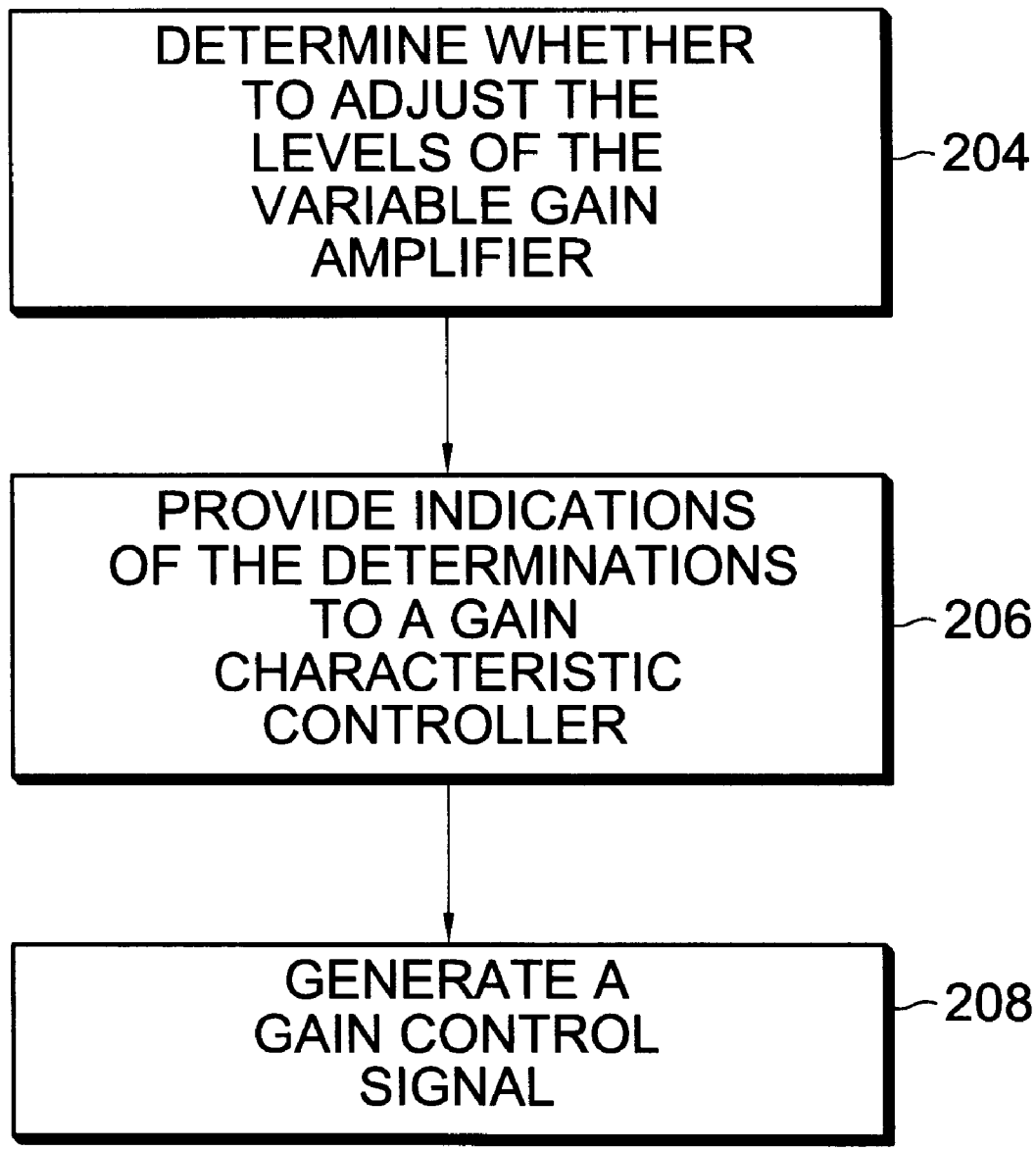
FIG. 9 illustrates a method flow diagram listing the method steps of the method of an embodiment of the present invention.

FIG. 9 illustrates a method, shown generally at 202, of an embodiment of the present invention. The method 202 provides a manner by which to gain a generate control signal for controlling levels of gain of a variable gain amplifier.

First, and as indicated by the block 204, a determination is made whether to adjust the levels of gain of the variable gain amplifier responsive to signals previously received and amplified by the variable gain amplifier. Then, and as indicated by the block 206, indications of the determinations made at the block 204 are provided to a gain characteristic controller. The gain characteristic controller exhibits a noise transfer function and a signal transfer function wherein the noise transfer function is dissimilar with the signal transfer function.

Then, and as indicated by the block 208, a gain control signal is generated at the gain characteristic controller. The gain control signal is a characteristic determined by the noise transfer function and the signal transfer function such that noise components of the gain control signal are located beyond a selected range of frequencies.

Operation of an embodiment of the present invention thereby provides a manner by which to control amplification levels of a variable gain amplifier. Circuitry used to form the gain control signal provides noise shaping properties for shaping noise components of the gain control signal and is operable over a wide dynamic range.

The previous descriptions are of preferred examples for implementing the invention, and the scope of the invention should not necessarily be limited by this description. The scope of the present invention is defined by the following claims.

We claim:

1. Gain control apparatus for selectively amplifying an input signal, said gain control apparatus comprising:

a variable gain amplifier having selectable gain characteristics and coupled to receive electrical signals representative of the input signal, said variable gain amplifier for amplifying the electrical signals with a selected gain characteristic;

a delta sigma modulator coupled to said variable gain amplifier in a gain control loop and exhibiting a signal transfer function and a noise transfer function, the signal transfer function and the noise transfer function exhibiting dissimilar characteristics said delta sigma modulator for generating a gain control signal of values which, when applied to said variable gain amplifier, are determinative of the selected gain characteristic by which the electrical signals are amplified, said delta sigma modulator for shaping a noise component of the gain control signal, such that the noise component is of frequencies offset in frequency by a frequency offset at least a selected amount relative to a fundamental frequency of the noise component.

2. The gain control apparatus of claim 1 wherein the gain control signal generated by said delta sigma modulator comprises an analog gain control signal.

3. The gain control apparatus of claim 1 wherein said delta sigma modulator comprises a first order delta sigma modulator.

4. The gain control apparatus of claim 1 wherein the signal transfer function exhibits substantially flat signal transfer characteristics over a range of frequencies corresponding to a selected channel upon which the input signal is received.

5. The gain control apparatus of claim 1 wherein the noise transfer function exhibits attenuation over a range of frequencies corresponding to a selected receive channel upon which the input signal is received.

6. The gain control apparatus of claim 1 wherein said delta sigma modulator generates a delta sigma-modulated signal and wherein said delta sigma modulator further comprises a digital-to-analog converter coupled to receive the delta sigma-modulated signal, said digital-to-analog converter for generating the gain control signal.

7. The gain control apparatus of claim 1 further comprising a signal processor coupled in the gain control loop together with said delta sigma modulator, to receive signals representative of the electrical signals, once amplified by said variable gain amplifier, said signal processor operable at least to execute a power control algorithm to form a power control signal, the power control signal applied, by way of the gain control loop, to said delta sigma modulator, the values of the gain control signal, at least in part, responsive to the power control signal.

8. The gain control apparatus of claim 7 wherein the variable gain amplifier forms a portion of a receiver, the receiver comprising a digital circuit portion and an analog circuit portion, wherein said signal processor comprises a digital signal processor, wherein said digital signal processor is embodied in the digital circuit portion of the receiver and said variable gain amplifier is embodied in the analog circuit portion of the receiver.

9. The gain controller apparatus of claim 8 further comprising a digital-to-analog converter coupled to said delta sigma modulator and wherein said delta sigma modulator is embodied in the digital circuit portion of the receiver and said digital-to-analog converter is embodied in the analog circuit portion.

10. The gain control apparatus of claim 9 wherein said delta sigma modulator generates a differential, delta sigma-modulated signal and said digital-to-analog converter is coupled to receive the differential, delta sigma-modulated signal.

11. A method for generating a gain control signal for controlling levels of gain of a variable gain amplifier, said method comprising the steps of:

determining responsive to signals previously received and amplified by the variable gain amplifier, at least whether to adjust the levels of gain of the variable gain amplifier by applying indications of signal levels of the signals previously received and amplified by the variable gain amplifier to a signal processor operable at least to execute a power control algorithm and executing the power control algorithm, thereby to generate indications of determinations whether to adjust the levels of gain of the variable gain amplifier, the indications of determinations a digital signal having a first resolution; and providing indicators of determinations made during said step of determining to a delta sigma modulator, the delta sigma modulator exhibiting a noise transfer function and a signal transfer function, the noise transfer function dissimilar with the signal transfer function;

generating the gain control signal at the delta sigma modulator, the gain control signal of characteristics determined by the noise transfer function and the signal transfer function such that noise components of the gain control signal are located beyond a selected range of frequencies.

12. The method of claim 11 wherein said step of generating the gain control signal comprises forming a delta sigma-modulated signal at the delta sigma modulator responsive to the indications provided thereto during said step of providing the delta sigma-modulated signal having a second resolution, and converting the delta sigma-modulated signal into analog form, the delta sigma-modulated signal, when converted into the analog form, forming the gain control signal.

13. The method of claim 12 further for controlling the levels of gain of the variable gain amplifier, said method comprising the further step of:

applying the delta sigma-modulated signal, once converted into analog form to form the gain control signal, to the variable gain amplifier, the noise components of the gain control signal shifted in frequency such that unwanted modulation of the noise components with the signals received by the variable gain amplifier forming unwanted modulation components are located at frequencies beyond a selected range of frequencies.

14. In a radio device having radio circuitry, an improvement of gain control apparatus, said gain control apparatus comprising:

a variable gain amplifier having selectable gain characteristics and coupled to receive electrical signals generated during operation of the radio circuitry, said variable gain amplifier for amplifying the electrical signals with a selected gain characteristic;

a delta sigma modulator coupled to said variable gain amplifier in a gain control loop, said delta sigma modulator for generating a gain control signal of values which, when applied to said variable gain amplifier, are determinative of the selected gain characteristic by which the electrical signals are amplified, said delta sigma modulator for shaping noise components of the gain control signal such that the noise components are of frequencies offset at least a selected amount relative to a fundamental frequency of the noise components; and said delta sigma modulator further comprising a digital-to-analog controller and said delta sigma modulator generating a delta sigma-modulated signal and said digital-to-analog controller for converting the delta sigma-modulated signal into an analog signal, the analog signal forming the gain control signal.

15. The gain control apparatus of claim 14 wherein the radio circuitry comprises a radio receiver and wherein the electrical signals to which said variable gain amplifier is coupled to receive comprises intermediate frequency, receive signals.

16. Gain control apparatus for selectively amplifying an input signal, said gain control apparatus comprising:

a variable gain amplifier having selectable gain characteristics and coupled to receive electrical signals representative of the input signal, said variable gain amplifier for amplifying the electrical signals with a selected gain characteristic;

a delta sigma modulator coupled to said variable gain amplifier in a gain control loop, said delta sigma modulator for generating a gain control signal of values which, when applied to said variable gain amplifier, are determinative of the selected gain characteristic by which the electrical signals are amplified, said delta sigma modulator for shaping a noise component of the gain control signal, such that the noise component is of frequencies offset in frequency by a frequency offset at least a selected amount relative to a fundamental frequency of the noise component; and said delta sigma modulator further comprising a digital-to-analog converter coupled to delta sigma modulator wherein said delta sigma modulator is embodied in the digital circuit portion of the receiver and said digital-to-analog converter is embodied in the analog circuit portion.

* * * * *